(12) United States Patent
Oi

(10) Patent No.: US 6,452,172 B1
(45) Date of Patent: Sep. 17, 2002

(54) COMPOSITE CHARGED PARTICLE BEAM APPARATUS

(75) Inventor: Masamichi Oi, Chiba (JP)

(73) Assignee: Seiko Instruments Inc. (JP)

( * ) Notice: Subject to any disclaimer, the term of this patent is extended or adjusted under 35 U.S.C. 154(b) by 0 days.

(21) Appl. No.: 09/313,118

(22) Filed: May 17, 1999

(30) Foreign Application Priority Data

May 19, 1998 (JP) ............................................ 10-137119

(51) Int. Cl.$^7$ ............................................. H01J 37/252
(52) U.S. Cl. ................. 250/309; 250/310; 250/396 ML
(58) Field of Search ......................... 250/396 ML, 310, 250/309, 396 R, 398

(56) References Cited

U.S. PATENT DOCUMENTS

| | | | | |
|---|---|---|---|---|
| 4,562,352 A | * | 12/1985 | Shiokawa | 250/305 |
| 4,891,524 A | * | 1/1990 | Yasuda et al. | 250/398 |
| 5,017,789 A | * | 5/1991 | Young et al. | 250/396 ML |
| 5,266,802 A | * | 11/1993 | Kasai | 250/310 |
| 5,306,921 A | * | 4/1994 | Tanaka et al. | 250/492.21 |
| 5,389,858 A | * | 2/1995 | Langner et al. | 315/370 |
| 5,629,526 A | * | 5/1997 | Nakasuji | 250/396 ML |
| 5,903,004 A | * | 5/1999 | Koshihara et al. | 250/310 |
| 5,994,704 A | * | 11/1999 | Nakasuji | 250/396 ML |
| 6,104,034 A | * | 8/2000 | Frosien et al. | 250/396 R |
| 6,188,071 B1 | * | 2/2001 | Gordon et al. | 250/397 |
| 6,303,932 B1 | * | 10/2001 | Hamamura et al. | 250/309 |

FOREIGN PATENT DOCUMENTS

| | | | |
|---|---|---|---|
| EP | 0150089 A1 | * 7/1985 | ............ H01J/37/10 |
| JP | 62216324 | 9/1987 | |
| JP | 7230784 | 8/1995 | |
| JP | 8-83591 | 3/1996 | |
| JP | 09061385 A | * 3/1997 | ......... G01N/23/227 |

\* cited by examiner

Primary Examiner—Kiet T. Nguyen
(74) Attorney, Agent, or Firm—Adams & Wilks

(57) ABSTRACT

A method of controlling a magnetic field in the path of a focused charged particle beam of a composite charged particle beam apparatus having at least one focused ion beam lens barrel and at least one electron beam lens barrel comprises the steps of measuring a residual magnetic field within a sample chamber housing the lens barrels, and controlling the magnetic field in the path of the focused charged particle beam so that the magnetic field is maintained at a previously measured value.

19 Claims, 3 Drawing Sheets

COMPOSITE CHARGED PARTICLE BEAM APPARATUS

BACKGROUND OF THE INVENTION

The present invention relates to a composite charged particle beam apparatus for forming a predetermined region of a sample surface by irradiating a focused ion beam while scanning over a predetermined region of the sample, and/or observing and/or performing an elemental analysis of the sample surface by irradiating the sample with a focused ion beam and detecting a secondary particle and/or an X ray generated in response to irradiation of the sample with an electron beam.

A composite charged particle beam has been realized which is capable of observing and analyzing a sample surface while scanning a focused ion beam or electron beam across a predetermined region of the sample in a sample chamber or irradiating it without scanning (switching, simultaneous irradiation, simultaneous non-irradiation are possible). This is convenient because a position formed by a focused ion beam can be observed at that instance by a scanning electron microscope and analyzed by EDS.

However, because gallium is used as a liquid metal ion source for a focused ion beam, if there is a magnetic field in the path of a focused ion beam, gallium isotopes or clusters are mass-separated resulting in deterioration in focused ion beam resolving power.

Where a focused ion beam should be used, if an excitation current of an objective lens of an electron beam lens barrel is rendered 0, the residual magnetism does not become 0. Accordingly, in a focused ion beam lens barrel in which a resolving power of approximately several nm is obtainable slight residual magnetism is problematic.

Also, as another problem, if the excitation current of the electron beam lens barrel is rendered 0 each time the focused ion beam lens barrel is used, there is disadvantage in reproducibility and stability in electron beam focusing when the electron beam lens barrel is to be again used.

An object of the present invention is to improve the reproducibility of electron beam focusing by a magnetic field leaked from a ground magnetism or EDS detector or electron beam lens barrel to a focused ion beam path and/or by reducing the effect of hysteresis of an objective lens of the electron beam lens barrel and/or to improve stability in electron beam focusing by reducing the effect of temperature drift in the electron beam lens barrel objective lens or electric circuit.

SUMMARY OF THE INVENTION

In order to solve the above-stated problem, a composite charged particle beam apparatus of the present invention has in the same sample chamber at least one focused ion beam lens barrel and at least one electron beam lens barrels, the composite charged particle beam apparatus being characterized in that a detector for magnetic field measurement capable of measurement of at least one direction component and memory means are provided within the sample chamber, and an electromagnetic technique for controlling a magnetic field in the path of a focused ion beam is provided.

Based on a measurement value of a magnetic field detector provided within a sample chamber, the magnetic field in the focused ion beam path is controlled by an electromagnetic technique whereby deterioration in resolving power due to mass-separation of the focused ion beam is prevented and/or reproducibility in electron beam focusing is improved and/or stability in electron beam focusing is improved by reducing the effect of temperature drift in the electron beam lens barrel objective lens and/or electric circuit.

DETAILED DESCRIPTION OF THE INVENTION

The invention is explained below based on an embodiment illustrated in the accompanying drawings.

Figure 1:
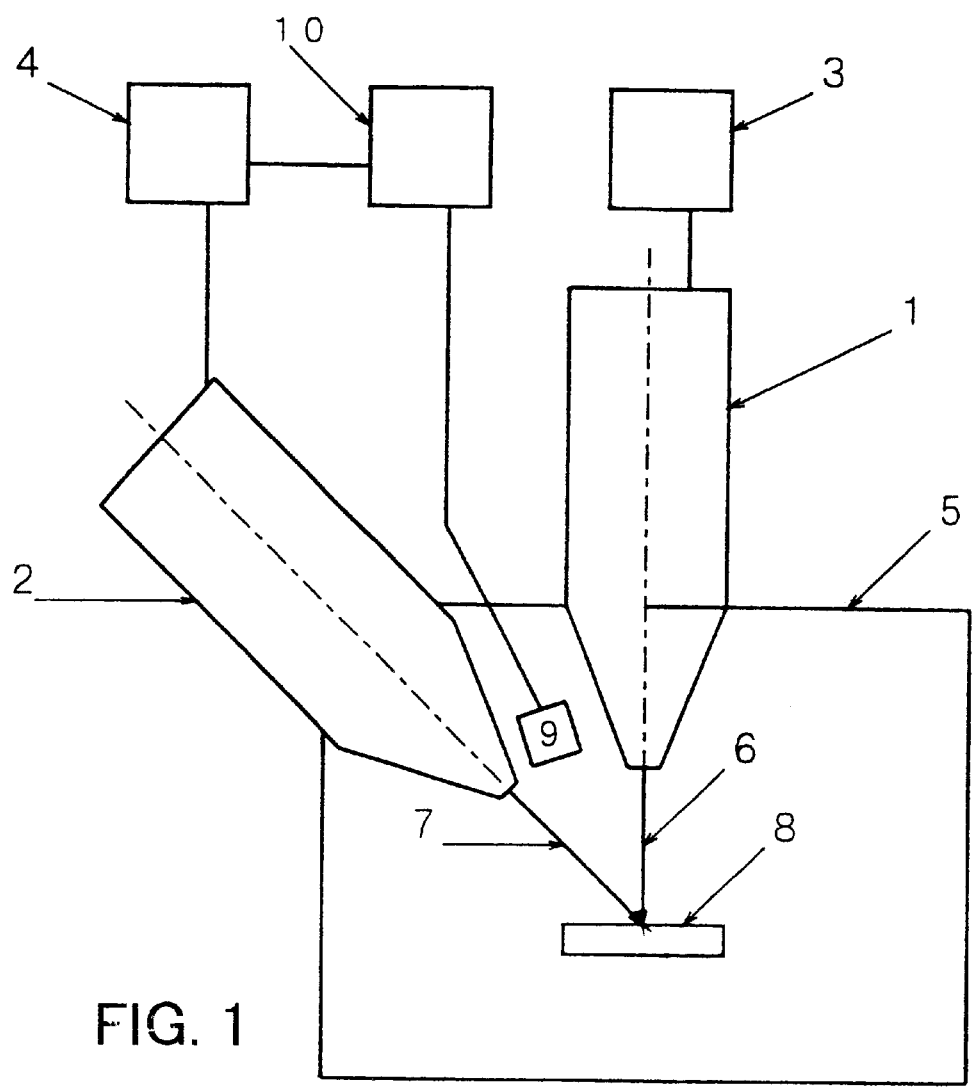
FIG. 1 shows a block diagram of one embodiment of the present invention.

FIG. 1 shows an embodiment of the present invention.

A focused ion beam lens barrel 1 and an electron beam lens barrel 2 (can adopt also an in-lens or semi-in-lens scheme for electron beam lens barrel 2 objective lens) are arranged within a same sample chamber 5 to enable irradiation of the same region of a sample 8. Further, a magnetic field detector 9 is arranged to measure a magnitude of the magnetic field generated by the objective lens of the electron beam lens barrel 2 in a manner so as not to obstruct paths of an electron beam 7 and a focused ion beam 6.

When using only a focused ion beam 6, an output of the magnetic field detector 9 provided in the sample chamber is monitored. The magnetic field generated by the objective lens of the electron beam lens barrel 2 is controlled by an electron beam lens barrel control system 4 so that the above value becomes a predetermined and memorized value (not necessarily 0 as the position of the magnetic field detector or other condition may be) that has no adverse effect on the resolving power of the focused ion beam 6.

When focusing the electron beam 7, an excitation current value of the electron beam lens barrel 2 objective lens is controlled by the electron beam lens barrel control system 4 so that the value of the magnetic field detector 9 within the sample chamber becomes a previously measured and memorized value when under a focusing condition.

Figure 2:
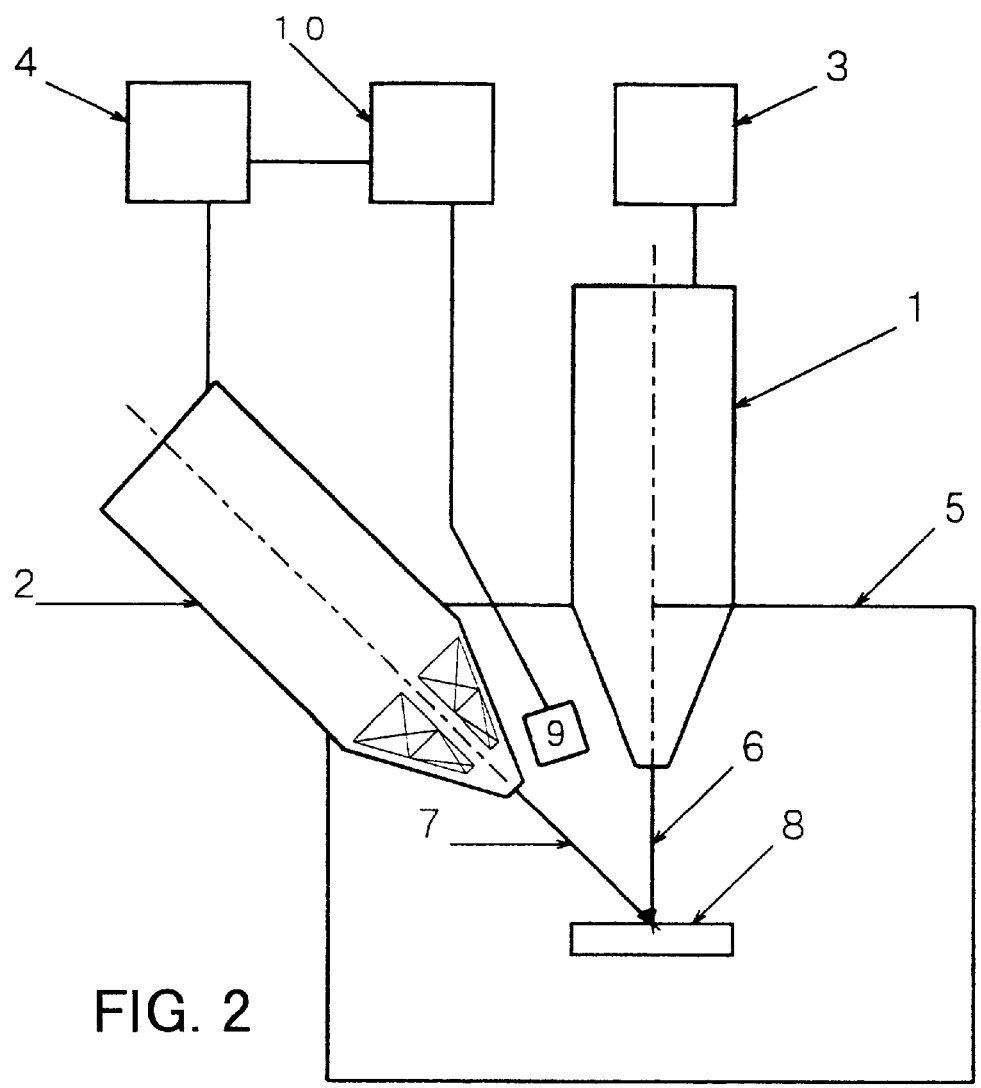
FIG. 2 shows a block diagram of another embodiment.

FIG. 2 shows another embodiment of the present invention.

Although basically operating similarly to FIG. 1, the coils of the objective lens are formed by two coils capable of separately controlling the excitation current one of which is always excited by the constant excitation current and the other controls the magnetic field of both N→S and S→N polarities according to an output of the electric circuit.

With such a structure, the objective lens has an excitation current always flowing greater than constant even when using only a focused ion beam 6. The instability in focusing due to temperature drift can be reduced.

Figure 3:
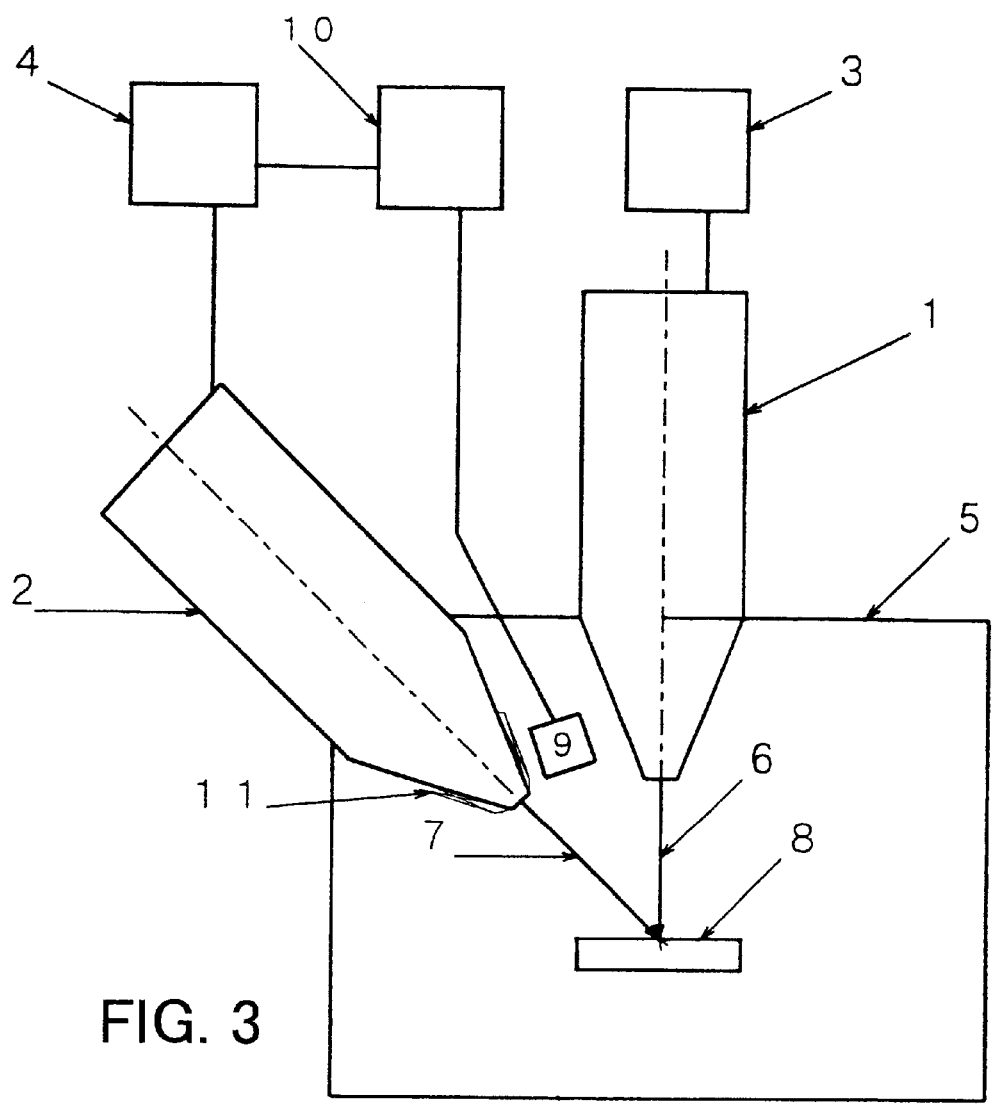
FIG. 3 shows a block diagram of still another embodiment.

FIG. 3 shows still another embodiment of the present invention.

Although basically operating similarly to FIG. 1, When using only a focused ion beam 6, the excitation current of the objective lens of the electron beam lens barrel 2 is rendered 0 and the residual magnetic field is controlled by other coil than the objective lens coil.

What is claimed is:

1. In a composite charged particle beam apparatus having, in a sample chamber, one or more focused ion beam lens barrels, one or more electron beam lens barrels, a magnetic field detector capable of measurement of at least one direction component of a magnetic field, and a memory for storing a magnetic field value measured by the magnetic field detector, a method for controlling a magnetic field in the path of a focused ion beam generated by a focused ion beam lens barrel, comprising the steps of:

using the magnetic field detector to detect a value of a magnetic field generated by a respective electron beam lens barrel that substantially does not interfere with a focused ion beam generated by a respective focused ion beam lens barrel and storing the detected value in the memory; and when a sample is to be treated using the respective focused ion beam lens barrel, using the detector to detect a magnetic field generated by the respective electron beam lens barrel and controlling the respective electron beam lens barrel to produce a magnetic field having the stored magnetic field value.

2. A method according to claim 1; wherein the magnetic field detector comprises a Hall effect element.

3. A method for controlling the magnetic field in the path of the focused ion beam according to claim 1; wherein the step of detecting a value of a magnetic field generated by a respective electron beam lens barrel comprises the step of measuring a magnetic field generated by an objective lens of the respective electron beam lens barrel; and the step of controlling comprises controlling an excitation current of the objective lens of the respective electron beam lens barrel by use of a single polarity electric circuit and exchanging polarities at input and output terminals of a coil of the electron beam lens barrel to invert a direction of an electric current flowing through the coil.

4. A method for controlling the magnetic field in the path of the focused ion beam according to claim 3; wherein the step of detecting a magnetic field value generated by a respective electron beam lens barrel comprises the step of measuring a magnetic field generated by an objective lens of the respective electron beam lens barrel; and wherein coils of the objective lens comprise two coils separately controllable in excitation current, one of which is always excited by a constant excitation current and the other of which controls a magnetic field of N→S and S→N polarities in response to signals received from an electric circuit.

5. A method for controlling the magnetic field in the path of the focused ion beam according to claim 1; wherein the step of detecting a value of a magnetic field generated by a respective electron beam lens barrel comprises the step of measuring a magnetic field generated by an objective lens of the respective electron beam lens barrel; and the step of controlling comprises controlling an excitation current of the objective lens of the respective electron beam lens barrel by use of an electric circuit capable of generating an output having alternating positive and negative polarities and inverting a direction of an electric current flowing through a coil of the electron beam lens barrel.

6. A method for controlling the magnetic field in the path of the focused ion beam according to claim 1; wherein the step of controlling comprises controlling the magnetic field by use of at least one coil provided separately from the objective lens of the respective electron beam lens barrel.

7. A method according to claim 6; wherein the objective lens of the respective electron beam lens barrel positively generates a magnetic field within the sample chamber.

8. A method according to claim 7; further comprising the step of performing an element analysis.

9. A method according to claim 6; further comprising the step of performing element analysis using EDS.

10. A method for controlling a magnetic field in a charged particle beam apparatus having plural charged particle beam generating systems, comprising the steps of:

determining a value of a magnetic field generated by a first charged particle beam generating system that does not interfere with a charged particle beam generated by a second charged particle beam generating system and storing the magnetic field value; and when a sample is to be treated using only the second charged particle beam generating system, generating a charged particle beam using the second charged particle beam generating system and controlling the first charged particle beam generating system to produce a magnetic field having the stored value so as to control the magnetic field in the path of the charged particle beam generated by the second charged particle beam generating system.

11. A method according to claim 10; wherein the determining step is performed using a Hall effect element.

12. A method according to claim 10; wherein the first charged particle beam generating system comprises one or more electron beam lens barrels, and the second charged particle beam generating system comprises one or more focused ion beam lens barrels.

13. A method according to claim 12; wherein the determining step comprises the step of measuring a magnetic field generated by an objective lens of an electron beam lens barrel and determining a measured magnetic field value that does not interfere with the charged particle beam generated by the second charged particle beam generating system; and the step of controlling comprises controlling an excitation current of the objective lens of the electron beam lens barrel by a single polarity electric circuit and exchanging polarities at input and output terminals of a coil of the electron beam lens barrel to invert a direction of an electric current flowing through the coil.

14. A method according to claim 13; wherein the determining step comprises the step of measuring a magnetic field generated by an objective lens of an electron beam lens barrel and determining a measured magnetic field value that does not interfere with the charged particle beam generated by the second charged particle beam generating system; and wherein coils of the objective lens comprise a pair of coils separately controllable in excitation current, one of the coils being excited by a constant excitation current and the other coil being controlled by an electric circuit for controlling the polarity of the magnetic field.

15. A method according to claim 12; wherein the determining step comprises the step of measuring a magnetic field generated by an objective lens of an electron beam lens barrel and determining a measured magnetic field value that does not interfere with the charged particle beam generated by the second charged particle beam generating system; and the step of controlling comprises controlling an excitation current of the objective lens of the electron beam lens barrel by use of an electric circuit capable of generating an output having alternating positive and negative polarities and inverting a direction of an electric current flowing through a coil of the electron beam lens barrel.

16. A method according to claim 12; wherein the step of controlling comprises controlling the magnetic field by use of one or more coils provided separately from the objective lens of the electron beam lens barrel.

17. A method according to claim 12; wherein the objective lens of at least one electron beam lens barrel generates a positive magnetic field.

18. A composite charged particle beam apparatus comprising: a sample chamber; one or more focused ion beam lens barrels disposed in the sample chamber; one or more electron beam lens barrels disposed in the sample chamber; a detector disposed in the sample chamber for detecting a magnetic field produced by an objective lens of a respective electron beam lens barrel and producing a detected magnetic field output signal; a memory for storing a detected value of the magnetic field of the respective electron beam lens barrel that does not interfere with a focused ion beam produced by a focused ion beam lens barrel; and a control circuit for controlling the respective electron beam lens barrel so that when a focused ion beam lens barrel is activated to irradiate a sample with a focused ion beam, the respective electron beam lens barrel is controlled to produce the stored magnetic field value.

19. A composite charged particle beam apparatus according to claim 18; wherein the memory stores a magnetic field value of the objective lens of the respective electron beam lens barrel and the circuit controls the objective lens so that when the focused ion beam lens barrel is deactivated and the electron beam lens barrel is reactivated an excitation current value applied to the objective lens is controlled so that the stored magnetic field value of the objective lens is obtained.

\* \* \* \* \*